United States Patent [19]

Kwo

[11] Patent Number: 5,523,587
[45] Date of Patent: Jun. 4, 1996

[54] METHOD FOR LOW TEMPERATURE GROWTH OF EPITAXIAL SILICON AND DEVICES PRODUCED THEREBY

[75] Inventor: Jueinai R. Kwo, Watchung, N.J.

[73] Assignee: AT&T Corp., Murray Hill, N.J.

[21] Appl. No.: 82,194

[22] Filed: Jun. 24, 1993

[51] Int. Cl.$^6$ .......................... H01L 29/04; H01L 31/036
[52] U.S. Cl. .............................. 257/64; 257/72; 257/627; 257/347
[58] Field of Search ................................ 257/64, 72, 627, 257/347

[56] References Cited

U.S. PATENT DOCUMENTS

| 5,304,357 | 4/1994 | Sato et al. | 452/250 |
| 5,306,651 | 4/1994 | Masumo et al. | 437/40 |

OTHER PUBLICATIONS

N. Sonnenberg, et al. "Preparation of biaxially aligned cubic zirconia films on pyrex glass substrates usinhg ion–beam assisted deposition" *J. Appl. Phys.*, vol. 74, No. 2, pp. 1027–1034.

*Primary Examiner*—Jerome Jackson
*Assistant Examiner*—John Guay
*Attorney, Agent, or Firm*—Glen E. Books

[57] ABSTRACT

In accordance with the invention, a thin layer of epitaxial silicon is grown at low temperatures at or below 300° C. by the steps of providing a substrate, forming an oriented dielectric buffer layer on the substrate and growing epitaxial silicon on the buffer layer. Preferably the substrate has a glass surface and the oriented buffer layer is cubic $ZrO_2$. The buffer layer is preferably oriented by bombarding it with a directed ion beam while the buffer layer is being deposited on the substrate. For example, a buffer layer of (100) cubic $ZrO_2$ can be grown at a temperature as low as 300° C. The oriented cubic $ZrO_2$ is an excellent buffer for epitaxial silicon on glass due to a good match of lattice parameters with silicon and a good match of thermal expansion coefficients with glass. An oriented (100) silicon epitaxial film can then be grown on the epitaxial template provided by the buffer layer at a temperature as low as 250° C. This low temperature process for producing epitaxial films offers multiple advantages: (1) reduced silicon interfacial defect densities and enlarged grain size permitting improved thin film transistor performance due to a lowered "off" current; (2) higher electron mobility permitting the fabrication of integrated displays; (3) lower temperature processing permitting the use of inexpensive glass substrates such as borosilicates; (4) sufficiently low temperature processing to permit the use of new lightweight substrates such as glass-coated polymeric materials (glass-coated plastics) which can substantially reduce the weight of displays and thus enhance the portability of portable computers, video telephones, and personal communicators; and (5) the use of new buffer layers such as $ZrO_2$ which can block the diffusion of Na ions from the substrate.

7 Claims, 2 Drawing Sheets

METHOD FOR LOW TEMPERATURE GROWTH OF EPITAXIAL SILICON AND DEVICES PRODUCED THEREBY

FIELD OF THE INVENTION

The present invention relates to methods for growing at low temperature layers of epitaxial silicon. Such layers are particularly useful for making thin film transistors and lightweight flat-panel display devices.

BACKGROUND OF THE INVENTION

With the rapid expansion of capacity to transmit and process information, devices for visually displaying information have become increasingly important. Lightweight, flat visual display devices are particularly needed for portable computers and wireless communications instruments.

One promising approach to providing flat-panel displays is the active matrix liquid crystal device (AMLCD). In essence the AMLCD comprises an array of thin film transistors, capacitors and electrodes formed on a transparent substrate and incorporated in an LCD display. Each thin film transistor controls an electrode which, in turn, polarizes a pixel-size region of liquid crystal. Typically the transistors are comprised of thin films of amorphous silicon. One difficulty with these devices, however, is that amorphous silicon lacks sufficient electron mobility to be used for drivers and registers in the display. Hence a hybrid structure combining amorphous silicon on glass and a crystalline silicon chip is required.

Polysilicon has higher electron mobility than amorphous silicon, and if polysilicon can be substituted for amorphous silicon in AMLCD devices, the entire display—complete with drivers—can be integrated on the substrate. However, few transparent materials can withstand the high temperatures, typically in excess of 600° C., required to grow polysilicon. Consequently efforts to make polysilicon based displays have required substrates of high temperature glass, such as fused quartz which are expensive, heavy, and fragile. Moreover typical thin films of polysilicon have randomly oriented grains producing random distribution of defect densities and non-uniform etching and oxidation characteristics. Accordingly, there is a need for a method for low temperature growth of silicon of enhanced electron mobility and reduced grain structure (hereafter "epitaxial silicon") which can utilize a wider variety of substrate materials.

SUMMARY OF THE INVENTION

In accordance with the invention, a thin layer of epitaxial silicon is grown at low temperatures at or below 300° C. by the steps of providing a substrate, forming an oriented dielectric buffer layer on the substrate and growing epitaxial silicon on the buffer layer. Preferably the substrate has a glass surface and the oriented buffer layer is cubic $ZrO_2$. The buffer layer is preferably oriented by bombarding it with a directed ion beam while the buffer layer is being deposited on the substrate. For example, a buffer layer of (100) cubic $ZrO_2$ can be grown at a temperature as low as 300° C. The oriented cubic $ZrO_2$ is an excellent buffer for epitaxial silicon on glass due to a good match of lattice parameters with silicon and a good match of thermal expansion coefficients with glass. An oriented (100) silicon epitaxial film can then be grown on the epitaxial template provided by the buffer layer at a temperature as low as 250° C. This low temperature process for producing epitaxial films offers multiple advantages: (1) reduced silicon interfacial defect densities and enlarged grain size permitting improved thin film transistor performance due to a lowered "off" current; (2) higher electron mobility permitting the fabrication of integrated displays; (3) lower temperature processing permitting the use of inexpensive glass substrates such as borosilicates; (4) sufficiently low temperature processing to permit the use of new lightweight substrates such as glass-coated polymeric materials (glass-coated plastics) which can substantially reduce the weight of displays and thus enhance the portability of portable computers, video telephones, and personal communicators; and (5) the use of new buffer layers such as $ZrO_2$ which can block the diffusion of Na ions from the substrate.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

Figure 1:
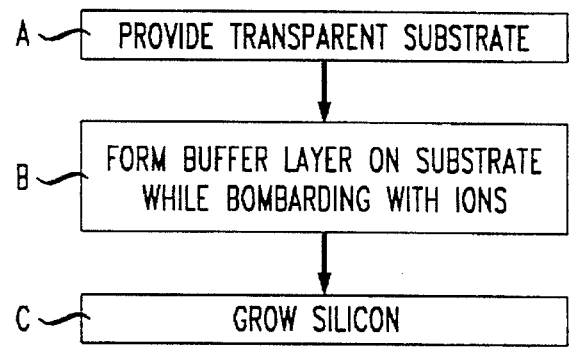
FIG. 1 is a flow diagram showing the steps of a preferred process for low temperature growth of epitaxial silicon.

It is to be understood that these drawings are for purposes of illustrating the concepts of the invention and are not to scale.

DETAILED DESCRIPTION

Referring to the drawings, FIG. I illustrates the steps for low temperature growth of polysilicon. As shown in block A of FIG. 1, the first step is to provide a suitable substrate such as a transparent body of glass or plastic. Preferred glasses include borosilicates such as Corning 7059. Preferred plastics include polyimides and polyethersulfone (PES). Advantageously plastic substrates are provided with a micron thick glass seed layer as by RF sputtering at low temperature.

The next step shown in block B is to provide the substrate with a suitable buffer layer for the epitaxial growth of silicon. The layer should be dielectric, have lattice parameters closely matching those of silicon (preferably matching within about 5%), and have a coefficient of thermal expansion which closely matches the substrate. Preferred buffer layer materials include cubic $ZrO_2$ stabilized by 8% yttrium, $CeO_2$, $PrO_2$, and $Y_2O_3$. The buffer layer is applied as an oriented layer by subjecting the substrate to a low energy ion bombardment at the same time the buffer layer is being applied. The beam is directed to maintain a velocity component in a predetermined direction parallel to the growth surface. Such a directed ion beam will preferentially remove misoriented grains and thereby promote the growth of an oriented buffer layer. For a given set of materials, the ion energy can be chosen below the energy level producing significant ablation of the buffer layer crystal structure. $ZrO_2$ buffer layers can be grown by e-beam evaporation while bombarding a glass-surfaced substrate with a beam of argon ions preferably having energy in the range 50–200 volts. This process can achieve a buffer layer with a (100) orientation in the predetermined direction, and a mosaic spread in the plane better than 2°.

Figure 2:
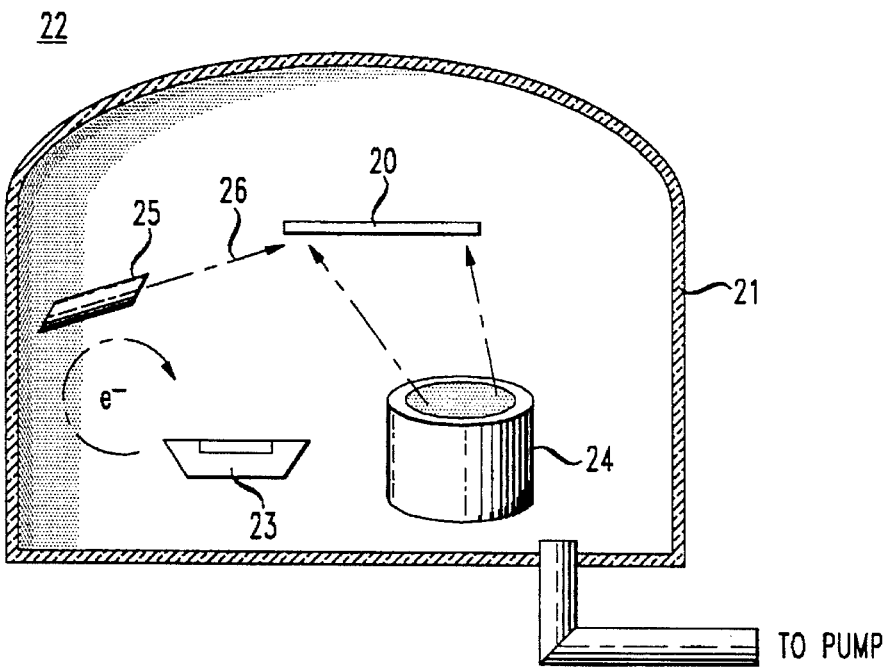
FIG. 2 shows apparatus for low temperature growth of epitaxial silicon.
Figure 2:
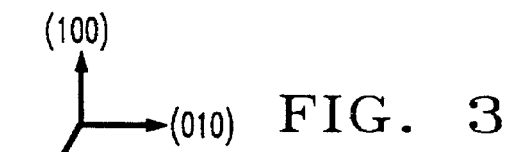

The third step shown in block C of FIG. 1 is to grow epitaxial silicon on the buffer layer using standard processes such as sputtering or low pressure chemical vapor deposition (CVD). This step can be better understood by reference to FIG. 2 which schematically shows preferred apparatus for both applying a buffer layer and growing the silicon layer. Specifically, the substrate 20 is mounted within the low pressure growth chamber 21 having a buffer source container 23 (e.g. $ZrO_2$) using e-beam evaporation and a silicon source container 24 using sputter deposition. The chamber is provided with means, such as an ion gun 25, for directing a beam of ions 26 such as argon onto substrate 20.

In operation, chamber 21 is evacuated to a low pressure of about $10^{-6}$ Torr or lower. The substrate 20 is heated to a temperature of about 300° C. by a heating element (not shown), and an electron beam is applied to source 23 to apply a thin buffer layer (about 500 Å–5000 Å thick) to the substrate and, at the same time, ion gun 25 is activated to direct a stream of argon ions at an angle of about 30° onto the growing surface. The buffer layer is grown with its (100) plane parallel to the major surface of the workpiece. Next the silicon source 24 will apply silicon atoms to the workpiece by sputtering with argon ions (or by low pressure CVD process). After silicon growth deposition, vacuum is broken and the epitaxial silicon coated workpiece is removed from the chamber for further processing as desired.

Figure 3:
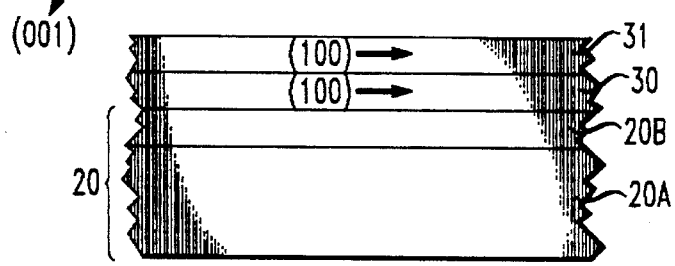
FIG. 3 is a schematic cross section of a typical workpiece prepared in accordance with the process of FIG. 1.

FIG. 3 is a schematic cross section of a resulting device showing the substrate 20 comprising a plastic body 20A having a seed layer of glass 20B. Preferably the substrate is transparent to visible light. The glass seed layer 20B can be produced on the body by RF sputter deposition from a glass target. Buffer layer 30 is grown on the glass surface, and silicon layer 31 is epitaxially grown on the buffer. In particular the silicon is grown with its (100) plane parallel to the major surface of the workpiece.

Figure 4:
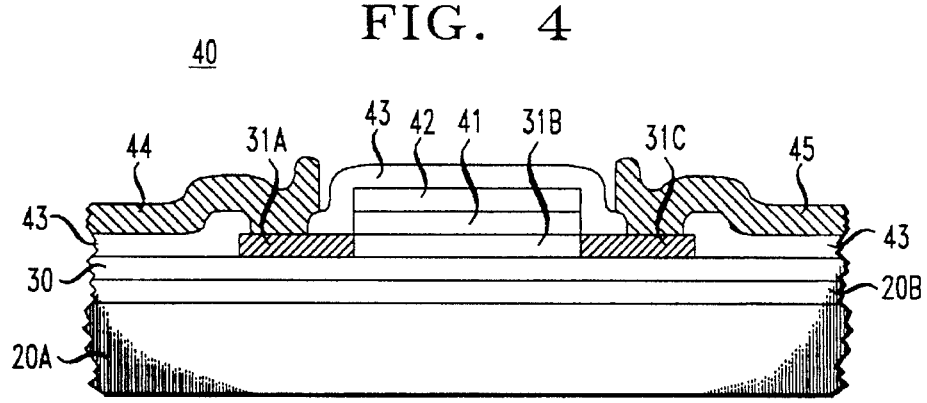
FIG. 4 is a schematic cross section of a thin film transistor made in accordance with the process of FIG. 1.

FIG. 4 illustrates a preferred device made in accordance with the invention comprising a self-aligned thin film transistor 40 formed on the workpiece of FIG. 3. Transistor 40 uses portions of an epitaxial silicon layer 31 grown in accordance with the method of FIG. 1 to form a transistor source 31A, a channel 31B and the drain 31C. Specifically, after the growth of the polysilicon layer 31, a gate oxide 41 is thermally grown or deposited, followed by a gate 42 of metal or polysilicon. After the gate is patterned, the source and drain 31A and 31C are formed on layer 31 by ion implantation. A thick insulator 43 such as $SiO_2$ is then deposited, and metal source and drain contacts 44 and 45 are applied through vias in the insulator 43.

Figure 5:
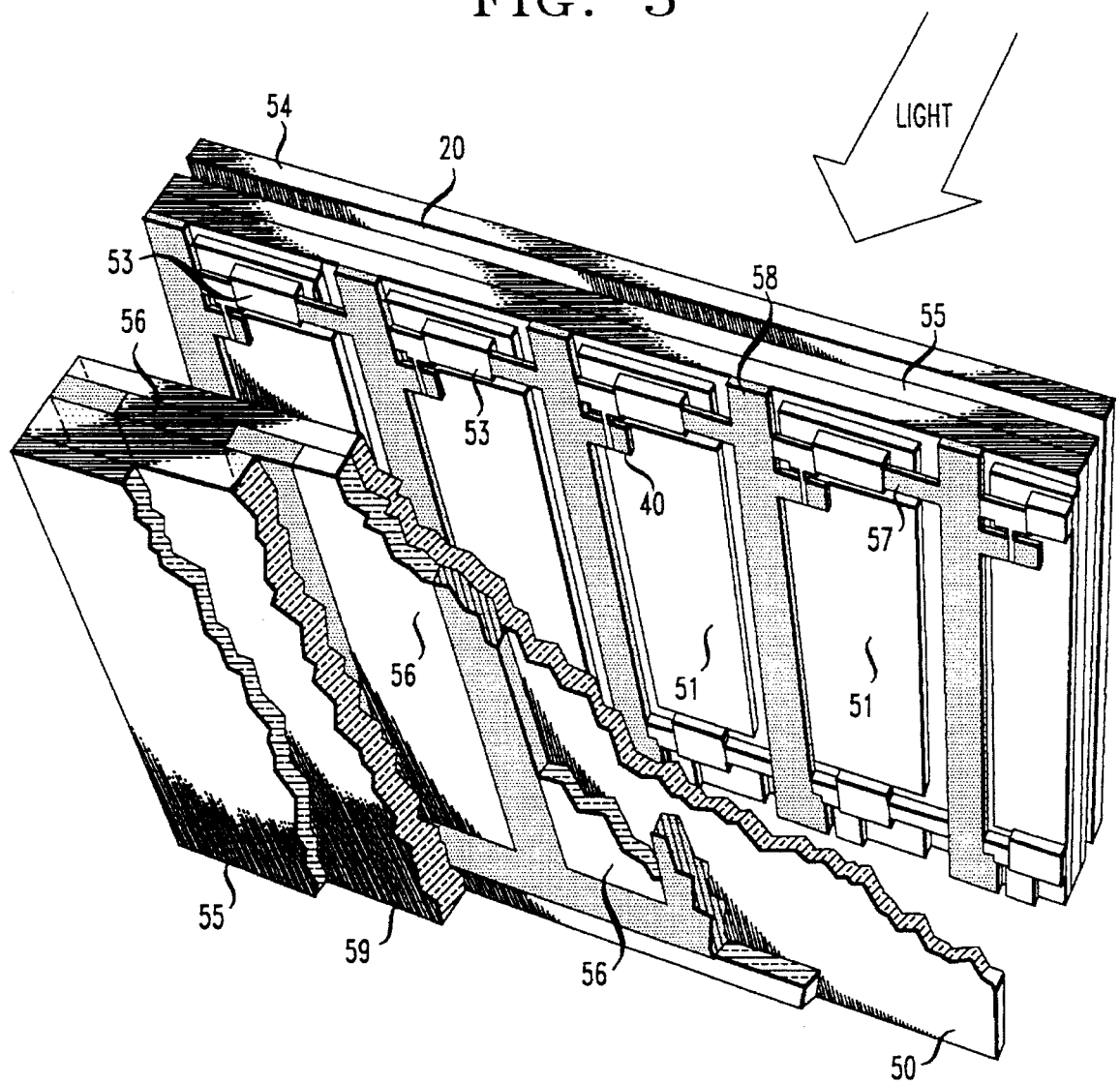
FIG. 5 shows the use of an array of thin film transistors used as pixel switches in a lightweight AMLCD device.

FIG. 5, which is a schematic rendering of a portion of an active matrix liquid-crystal device, shows how the device of FIG. 4 can be used to make an improved flat display. In essence the AMLCD comprises a liquid crystal medium (not shown) disposed between a transparent common electrode 50 and an array of transistors 40 and local electrodes 51 (preferably pixel-size) all disposed on a common substrate 20. Each local electrode is switched by an associated transistor 40 interconnected to an associated storage capacitor 53. The transistors 40 thereby control the state of the voltage on each local electrode and, in accordance with well known principles, control the optical state of a pixel size liquid crystal region.

In accordance with conventional structure, the AMLCD includes a back light (not shown), a diffuser 54, polarizers 55 and, if color is desired, a grid of color filter layers 56 disposed on a transparent substrate 59. Rows of transistor gates can be interconnected via conductive gate lines 57 and columns of transistor sources can be interconnected via conductive data lines 58 for switchable control of individual pixels.

The AMLCD of FIG. 5 is of conventional construction except that the transistors 40 are epitaxial silicon thin film transistors formed of a layer of (100) oriented epitaxial silicon (not shown in FIG. 5) grown at low temperature in accordance with the method of FIG. 1. Preferably the transistors are self-aligned coplanar transistors 40 formed on a glass-coated plastic substrate 20 such as are shown in FIG. 4.

The advantages of using the inventions of FIGS. 1 and 4 in this AMLCD include enhanced transistor performance and the availability of a wider variety of substrate materials such as borosilicate glasses and even glass-coated plastics. A substantial reduction in weight is obtainable when the low temperature process of the invention permits the fabrication of epitaxial silicon devices on plastic substrams rather than glass. In addition to lighter weight, the AMLCD devices with plastic substrates are more shock resistant, more flexible, and less expensive.

The new low temperature process for producing epitaxial silicon films offer multiple advantages in the fabrication of thin film silicon devices. (1) Thin film transistor performance is enhanced due to a lowered "off" current by reducing the interfacial detect densities and enlarging the grain size. (2) Electron mobility is increased. (3) Inexpensive glass substrates such as borosilicates can be used. (4) New lightweight substrates such as glass-coated plastics can be used, substantially reducing the weight and increasing the portability of displays for portable computers, television sets, video telephones, and personal communicators. (5) The conventional $SiO_2$ diffusion barrier can be replaced by a $ZrO_2$ buffer layer which blocks effectively the diffusion of Na ions from the substrate.

I claim:

1. A silicon device comprising:

a substrate comprising a body of material having a planar major surface and a layer of glass overlying said major surface;

overlying said glass layer a (100) oriented buffer layer of dielectric material; and overlying said buffer layer a (100) oriented layer of silicon.

2. A device according to claim 1 wherein said substrate is transparent to visible light.

3. A device according to claim 1 wherein said body comprises a body of polymeric material.

4. A device according to claim 3 wherein said polymeric material is a polyimide or a polyethersulfone.

5. A device according to claim 1 wherein said buffer layer comprises $ZrO_2$, $CeO_2$, $PRO_2$ or $Y_2O_3$.

6. A thin film transistor comprising a source, a gate-controlled channel and a drain disposed upon a substrate having a planar major surface wherein said source, channel and drain comprise a layer of (100) oriented silicon overlying said planar major surface and said substrate comprises a body of polymeric material and a layer of glass overlying said body of polymeric material, said transistor further comprising a buffer layer of (100) oriented dielectric material disposed between said layer of glass and said layer of silicon.

7. A liquid crystal display comprising a common electrode, a liquid crystal medium, and a plurality of transistor-controlled local electrodes for controlling local regions of the liquid crystal medium wherein one or more of the transistors for controlling said local electrodes comprises a transistor in accordance with claim 6.

* * * * *